United States Patent [19]
Endo et al.

[11] Patent Number: 5,703,397
[45] Date of Patent: Dec. 30, 1997

[54] SEMICONDUCTOR PACKAGE HAVING AN ALUMINUM NITRIDE SUBSTRATE

[76] Inventors: Mitsuyoshi Endo, 25-23-3F Higashikashiwagaya 4-chome, Ebina-shi, Kanagawa-ken; Hironori Asai, 2469-6-625 Nagatsudacho, Midori-ku, Yokohama-shi, Kanagawa-ken; Keiichi Yano, 11-301, Daishihoncho 8-chome, Kawasaki-ku, Kawasaki-shi, Kanagawa-ken; Yoshitoshi Sato, 33-19, Ayasa 1-chome, Adachi-ku, Tokyo, all of Japan

[21] Appl. No.: 745,367

[22] Filed: Nov. 8, 1996

Related U.S. Application Data

[63] Continuation of Ser. No. 982,542, Nov. 27, 1992, abandoned.

[30] Foreign Application Priority Data

| Nov. 28, 1991 | [JP] | Japan | 3-314601 |
| Nov. 29, 1991 | [JP] | Japan | 3-316999 |
| May 20, 1992 | [JP] | Japan | 4-127280 |

[51] Int. Cl.⁶ .......... H01L 23/053; H01L 23/12
[52] U.S. Cl. .......... 257/701; 257/697; 257/700; 257/704; 257/705
[58] Field of Search .......... 257/697, 703, 257/704, 700, 701, 702, 774, 719

[56] References Cited

U.S. PATENT DOCUMENTS

| T105,403 | 5/1985 | Hultmark | 257/719 |
| 3,916,434 | 10/1975 | Garboushian | 257/704 |
| 4,417,392 | 11/1983 | Ibrahim et al. | 257/703 |
| 4,827,327 | 5/1989 | Miyauchi et al. | 357/71 |
| 4,833,102 | 5/1989 | Byrne et al. | 257/704 |
| 5,018,004 | 5/1991 | Okinaga et al. | 357/74 |
| 5,045,639 | 9/1991 | Liu et al. | 257/697 |
| 5,095,359 | 3/1992 | Tanaka et al. | 257/691 |
| 5,097,318 | 3/1992 | Tanaka et al. | 257/704 |
| 5,122,862 | 6/1992 | Kajihara et al. | 257/704 |
| 5,311,402 | 5/1994 | Kobayashi et al. | 257/779 |

FOREIGN PATENT DOCUMENTS

| 0 265 367 | 4/1988 | European Pat. Off. . | |
| 0361495A3 | 4/1990 | European Pat. Off. . | |
| 0018944 | 2/1983 | Japan | 257/704 |
| 0114845 | 7/1984 | Japan | 257/704 |
| 63-100758 | 5/1988 | Japan . | |
| 0028853 | 1/1989 | Japan | 257/704 |
| 1-111360 | 4/1989 | Japan . | |
| 1-272140 | 10/1989 | Japan . | |
| 0011653 | 1/1991 | Japan | 257/704 |

OTHER PUBLICATIONS

Patent Abstracts of Japan, vol. 10, No. 24, (E-377); dated Jan. 30, 1986.

Harada et al., "Fine Pitch High-Density PGA Package," IEEE International Solid-State Circuits Conference, Digest of Technical Papers, pp. 154, 155, 288 (1990).

Primary Examiner—Tom Thomas
Assistant Examiner—David Ostrowski

[57] ABSTRACT

A semiconductor ceramic multilayer package comprising an aluminum nitride substrate having a semiconductor element mounted on one surface thereof and a wiring pattern electrically connected to the semiconductor element, connecting terminals connected to the wiring pattern and disposed on the other surface of the aluminum nitride substrate, and a sealing member connected to the aluminum nitride substrate with a metallic bonding layer or a glass layer having a thickness of not more than 100 μm in such a manner as to seal the semiconductor element possesses a notably improved heat-radiating property and accomplishes the object of increasing the number of pins and reducing the size of package.

14 Claims, 8 Drawing Sheets

SEMICONDUCTOR PACKAGE HAVING AN ALUMINUM NITRIDE SUBSTRATE

This application is a continuation of application Ser. No. 07/982,542 filed Nov. 27, 1992, now abandoned.

BACKGROUND OF THE INVENTION

This invention relates to a semiconductor package using an aluminum nitride substrate.

Semiconductor chips are generally used as packaged with a ceramic substrate, for example, for the purpose of protection against the external environment and enhancement of the convenience of handling. Incidentally, the advance in the technology for production of semiconductors has been lending a powerful impetus to rapid growth of semiconductor chips in terms of degree of integration and high-speed capacity. As observed in power transistors, the semiconductor chips have come to be endowed with an increasingly large capacity for electric power. Since the amounts of heat emitted by such semiconductor chips increase proportionately to the growth of the semiconductor chips in capacity for electric power and degree of integration, the desirability of improving the semiconductor packages in capacity for heat release has been finding enthusiastic recognition.

In order to improve the semiconductor packages in the ability to release heat, if necessary, metallic heat radiating fins as joined to ceramic substrates, i.e. the main bodies of packages, has been used. When due consideration is given to this fixation of the heat radiating fins, it is used for the semiconductor packages to be constructed in the cavity down type having cavities for holding semiconductor chips opened downwardly and, at the same time, having lead pins joined to the cavities on the open surface side thereof.

As the demand for further miniaturization and of various electronic devices is steadily gaining in earnestness, the necessity of realizing greater densification of component elements in semiconductor packages has come to win widespread approval. Thus, there has been awakened an earnest desire for further miniaturization and densification of the semiconductor packages themselves. The miniaturization of the semiconductor packages has been also longed for from the standpoint of reducing delay of signals by shortening the length of wires distributed within the packages. Further, the number of input/output signals per element in the semiconductor chips is tending to increase in consequence of the growing integration of the semiconductor chips. Since in case of the semiconductor packages of the aforementioned cavity down type pins can not be provided on the surface mounting the semiconductor chips and its neighborhood, the semiconductor packages of the cavity up type apparently prove to be advantageous in due consideration of the ability to allow an increase in the number of input/output signals or the number of pins.

FIG. 9 illustrates one example of the construction of the conventional cavity up type semiconductor package. In this diagram, 1 stands for a multilayer ceramic substrate provided with an internal wiring layer 4 comprising a signal wiring 2, a ground layer 3, etc. An upper open type cavity 1a of this multilayer ceramic substrate 1 accommodates a semiconductor chip 5 therein. The cavity 1a holding the semiconductor chip 5 is sealed airtightly as with a metallic cap 6 and the semiconductor chip 5 is electrically connected to the internal wiring layer 4 through the medium of a bonding wire 7 and a surface wiring layer 8. To the remaining surface of the multilayer ceramic substrate 1 is joined a lead pin 9 which is electrically connected to the internal wiring layer 4.

The cavity p type semiconductor package allows a wide junction area for the lead pin 9 as illustrated in FIG. 9 and, therefore, permits an increase in the number of pins (in the degree of integration of semiconductor chips) and a decrease in the size of package. Since it does not permit easy additional use of heat radiating fins, however, it has the problem of being incapable of securing an ample capacity for release of heat. It is structurally difficult for such heat radiating fins to be directly joined to the semiconductor package on the cavity 1a side. If the heat radiating fins are attached to the cap 6 which is airtightly sealing the cavity 1a, they cannot be made to function effectively because no sufficient heat transfer area is secured in the interface between the heat radiating fins and the package proper. If the heat radiating fins are joined to the periphery of the cavity 1a, the miniaturization of package will disrupt provision of an ample heat transfer area.

In the light of these hindrances, there may be conceived an idea of enlarging the path for radiating heat by increasing the thickness of each component layer of the ceramic multilayer substrate destined to form the package proper. In this case, however, the following problems will arise. For the purpose of expediting the electric circuit operation, it is indispensable to treat the wiring layer within the package as a path for transmission and control the characteristic impedance of this path of transmission. Here, the characteristic impedance of the path of transmission is fixed by the inductance of the path of transmission and the capacitance between the path of transmission and the ground layer. In other words, the characteristic impedance of the wiring layer in the semiconductor package using the ceramic multilayer substrate is fixed by the volume (thickness ×width) of the wiring layer and the thickness of each component layer. When the thicknesses of such layers are varied for the purpose of increasing the area of the path for heat release, therefore, it possibly becomes necessary not only to make a basic alteration in the package design (electric circuit design) but also to change the visible contour of the package itself. This fact may possibly preclude successful miniaturization of the package.

In recent years, the advance of semiconductor chips toward higher degree of integration and higher operational speed has been tending to increase the number of input/output signals to be handled by the semiconductor chips in a great measure. In consequence of the great increase in the number of signals handled by semiconductor chips, the packages for accommodating such semiconductor chips have come to adopt very frequently a ceramic multilayer substrate which is provided internally with a concurrently fired wiring layer of Mo and W and on the surface thereof with a thin-film wiring layer of Al and Au. The reason for this popular use of the ceramic multilayer substrate is that the technology for thin film formation enables a surface wiring to be produced with a very narrow wiring pitch on the order of 60 µm and, consequently, facilitates the formation of a high-density wiring.

Since the surface wiring layer of a thin film exhibits a high value of resistance per unit length as compared with the internal wiring layer, the relative increase of the length of the thin film signal wiring on the surface entails an addition to the overall resistance of the package. This fact poses a serious hindrance to the development of a semiconductor chip enjoying an enhanced operational speed and allowing a reduction in power consumption. When the range of the thin film surface wiring layer to be formed is increased, the possibility of dust or other similar fine conductive substance adhering to the wiring during the subsequent step of plating or conveyance will increase. The defilement of the wiring has the problem of exposing the produced package to intolerable defects such as short circuits.

Though the conventional semiconductor package allows an increase in the number of pins and a reduction in the size of package, it encounters difficulty in securing an ample capacity for heat release as described above. In the present state of affairs, therefore, this semiconductor package is not fully capable of handling effectively semiconductor chips of enhanced integration and improved operational speed. The desire to enhance the capacity for heat release may possible prompt an idea of increasing the thickness of each component layer of the ceramic multilayer substrate. This idea is not quite feasible, however, because it entails various problems such as compelling alteration of an electric circuit design and inhibiting the size reduction of package. Though the ceramic multilayer package which makes use of a thin film surface wiring layer can cope with densification of wiring, the conventional wiring design has many problems yet to be solved because it is liable to add to the length of the thin film signal wiring on the surface, increase the overall resistance of the semiconductor package and the size of the package, and give birth to short circuits in the subsequent steps of manufacture.

In the circumstances, the desirability of developing a semiconductor package which allows size reduction of package and renders further integration of semiconductor chips feasible has been receiving growing recognition. To be more specific, a strong desire has been expressed for successful development of a semiconductor package which allows further integration of semiconductor chips and consequent addition of the number of pins admitted in the package, permits size reduction of package, secures an ability to effect ample release of the heat emitted in a large amount from the semiconductor chips, facilitates the formation of a surface wiring layer and warrants a reduction in the cost for production of the semiconductor package, further realizes a decrease in the resistance of the signal wiring for the entire package and a reduction in the size of the package, infallibly curbs the occurrence of defects, and adapts ideally for high-speed devices.

SUMMARY OF THE INVENTION

This invention, produced to cope with the problems of the prior art mentioned above, has as a principal object thereof the provision of a semiconductor package which permits an increase in the number of pins to be admitted therein and a reduction in the size of package and allows appreciable improvement in the ability to effect release of heat. It has another object of providing a semiconductor package which permits a cut in the cost of production in addition to fulfilling the primary object mentioned above.

This invention has as a further object thereof the provision of a semiconductor package which realizes appreciable improvement in the ability to effect heat release without requiring any alteration of electric circuit design and renders feasible the measure to further the integration and increase the operational speed of semiconductor chips in addition to accomplishing the addition of the number of pins and the reduction of the size of package.

Yet another object of this invention resides in providing a semiconductor ceramic multilayer package which realizes a decrease in the overall resistance of signal wiring in the whole package and a reduction in the size of the package, successfully curbs occurrence of defects, and adapts ideally for high-speed devices.

The first semiconductor package of this invention comprises an aluminum nitride substrate having semiconductor elements mounted on one main surface thereof and wiring patterns connected electrically to the semiconductor elements, a multiplicity of connecting terminals connected electrically to the wiring patterns and disposed on the other main surface of the aluminum nitride substrate, and a highly thermally conductive ceramic sealing member having a U-shaped cross section for receiving the semiconductor element or the shape of a flat plate and joined to the aluminum nitride substrate in such a manner as to cover (seal) the semiconductor elements, which semiconductor package is characterized in that the aluminum nitride substrate and the sealing member are joined through the medium of a metallic bonding agent (because of highly thermal conductivity) or a layer of glass bonding agent not exceeding 100 µm in thickness. The second semiconductor package of this invention comprises an aluminum nitride substrate having semiconductor elements mounted on one surface thereof and wiring patterns connected electrically to the semiconductor elements, a multiplicity of connecting terminals connected electrically to the wiring patterns and disposed after the fashion of a lattice on the other surface of the aluminum nitride substrate, and a ceramic sealing member joined to the aluminum nitride substrate in such a manner as to cover the semiconductor elements, which semiconductor package is characterized in that the intercentral distance of the adjacent connecting terminals is not more than 1.27 mm (50 mils) or the distance from the terminal surface of the external edge (outer periphery) of the surface of the aluminum nitride substrate to the connecting terminals is larger than the intercentral distance of the adjacent connecting terminals.

Then, the third semiconductor package of this invention comprises an aluminum nitride multilayer substrate having semiconductor elements mounted on one surface thereof and wiring patterns connected electrically to the semiconductor elements, a sealing member covering the semiconductor elements in such a manner as to seal them, and a multiplicity of connecting terminals connected electrically to the wiring patterns and disposed on the other surface of the aluminum nitride multilayer substrate, which semiconductor package is characterized in that the aluminum nitride multilayer substrate has superposed integrally there in the direction of thickness thereof an aluminum nitride wiring layer provided with an internal wiring and an aluminum nitride heat-conducting layer destined to form a path for release of heat.

The fourth semiconductor package of this invention comprises an internal signal wiring layer, a thin film surface signal wiring layer provided in one terminal part thereof with connecting pads, and via holes through which the internal wiring layer and the thin film surface signal wiring layer are connected electrically to each other, which semiconductor package is characterized in that the via holes are arranged in a plurality of rows, the length of signal wirings of the thin film surface signal wiring layer is not more than one half, preferably not more than one quarter, of the total length of all the signal wirings in the whole package. The via holes are desired to be arranged in a plurality of rows and extended along the opposite sides of the row of connecting pads.

Now, the effects derived from the semiconductor packages of this invention enumerated above will be specifically described below.

In the semiconductor package of the first aspect of this invention, since the semiconductor elements are mounted on the surface opposite to a junction surface for lead pins, the package attains size reduction in addition to satisfying the measure taken to increase the number of pins to be admitted therein. The fact that basically the package proper is formed of the aluminum nitride substrate excellent in thermal conductivity, the semiconductor elements are covered (sealed) with the ceramic sealing member of aluminum nitride excellent in thermal conductivity, optionally heat radiating fins are formed on the sealing member. Since the sealing member is joined with a metallic bonding layer excellent in thermal conductivity, it effectively conducts the heat generated in the semiconductor chip and the aluminum nitride multilayer substrate and allows the package to manifest an excellent heat-radiating property. Specifically, this construction allows the thermal resistance of the semiconductor package to be kept below 3° C./W. When this joining is made through the medium of a glass bonding layer, the layer of this glass bonding agent to be interposed has a thickness of not more than 100 μm, preferably not more than 50 μm. This glass bonding layer, by having the thickness thereof set at such a small magnitude as mentioned above, is enabled to keep the thermal resistance of the semiconductor package to a very low level and secure ample bonding strength between the ceramic sealing member and the aluminum nitride substrate even when the glass used for the bonding layer has low thermal conductivity. When the sealing member used in this case is formed in a U-shaped cross section, and particularly when the aluminum nitride substrate is in the form of a flat-surface substrate devoid of a cavity, this sealing member enables the area of junction between the sealing member and the substrate to be enlarged and, as a result, causes the heat from the aluminum nitride substrate to be more efficiently conducted to the ceramic sealing member and thence dispersed into the ambient air.

In the semiconductor package of the second aspect of this invention, the junction area between the aluminum nitride substrate and the sealing member of an excellent heat radiating property can be further enlarged because the connecting terminals are allowed to avail themselves of prescribed non-junction areas in the external edge part of the surface of the aluminum nitride substrate and the non-junction areas are given a size larger than the intercentral distance between the adjacent connecting terminals. Thus, the package is allowed to acquire an enhanced ability to effect heat release. The fact that the non-junction areas (non-layout areas) are formed in large sizes for the sake of the connecting terminals as described above allows the aluminum nitride substrate of an outstanding heat-radiating property to increase the area or volume thereof beyond the fixed area for the disposition of the connecting terminals and ensures ample heat radiation even when the degree of densification is high, the intercentral distance between the adjacent connecting terminals is small, and the semiconductor package is also small. Specifically, in the semiconductor package of this invention, the intercentral distance of the connecting terminals is set at less than 1.27 mm (50 mils). Thus, the package is allowed to acquire a reduction in the length of internal wirings and is adapted effectively to the improvement of semiconductor elements in operational speed.

In the semiconductor package of the third aspect of this invention, the package proper is formed of a ceramic multilayer substrate which comprises an aluminum nitride wiring layer provided with internal wirings and an aluminum nitride heat-conducting layer destined to form a path for release of heat. Owing to the use of this ceramic multilayer substrate, the electric characteristics such as the characteristic impedance of internal wirings can be designed without regard to the heat radiating property and the package is allowed size reduction. Further, the package itself is enabled to acquire an ample heat-radiating property, namely a sufficient area for the path of heat radiation. Thus, the package is adapted for further improvement of the semiconductor elements in the degree of integration and the speed of operation and, at the same time, allowed a reduction in the size of package.

In the semiconductor package of the fourth aspect of this invention, the length of the signal wirings in the surface signal wiring layer which has a high value of resistance per unit length as compared with the internal signal wiring layer is so short as to account for not more than one half of the total length of all the signal wirings. This appreciable decrease in the length of the surface signal wirings is accomplished by arranging the via holes in a plurality of rows and further distributing these rows of via holes along the opposite sides of the row of connecting pads. Owing to the decreased length, the package is allowed to acquire a decrease in the overall resistance of package and enabled to operate ideally even when the package has high-speed operation type semiconductor chips mounted thereon. Further, the arrangement of the via holes in a plurality of rows allows the area of formation of the thin film surface signal wiring layer to be decreased and, therefore, facilitates the size reduction of the package and, at the same time, curbs the occurrence of short circuits and other defects.

DESCRIPTION OF THE PREFERRED EMBODIMENTS

Now, the first semiconductor package of this invention will be described below with reference to the accompanying drawings.

Figure 1:
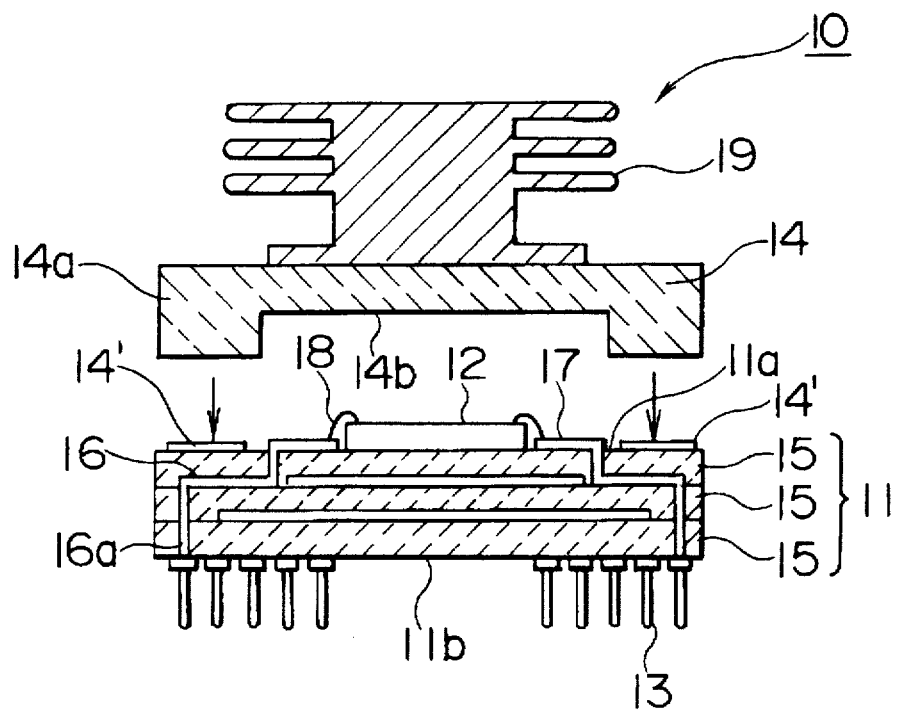
FIG. 1 is a cross section illustrating the construction of a semiconductor package as one embodiment of this invention.

FIG. 1 is a cross section illustrating the construction of one example of the semiconductor package of this invention. A semiconductor package 10 illustrated in this diagram is constructed with a semiconductor chip 12 such as LSI or power IC mounted on an upper surface 11a of an aluminum nitride multilayer substrate 11 and lead surface joined to a lower surface 11b of the aluminum nitride multilayer substrate 11. The upper surface 11a of the aluminum nitride multilayer substrate 11 on which the semiconductor chip 12 is mounted is covered with a sealing member made of aluminum nitride and formed in a U-shaped cross section. Further, heat-radiating fins 19 are provided on the sealing member 14.

The aluminum nitride multilayer substrate 11 is a multilayer wiring substrate formed by having a multiplicity of ceramic layers 15 integrally superposed. On each component ceramic layer 15, an internal wiring layer 16 having a prescribed wiring pattern is provided. The internal wiring layer 16 contains via holes 16a packed with a conductive substance and it is connected electrically through the via holes 16a to a surface wiring layer 17 formed on the surface 11a of the aluminum nitride multilayer substrate 11 supporting the semiconductor chip. Since the surface wiring layer 17 is capable of high-density wiring, it is produced in the form of a thin film wiring by using such thin film forming technique as spattering method or vacuum deposition method. The semiconductor chip 12 mounted on the substrate is connected electrically to the surface wiring layer 17 through the medium of a bonding wire 18. The lead pins 13 are joined to the lower surface 11b of the aluminum nitride multilayer substrate 11 in such a manner as to be connected electrically to the internal wiring layer 16. The aluminum nitride multilayer substrate 11 constructed as described above is manufactured by simultaneously firing the substrate itself (component ceramic layers 15) and a conductive substance destined to form the internal wiring layer 16, for example.

The surface 11a of the aluminum nitride multilayer substrate 11 supporting the semiconductor chip is covered as described above with the sealing member 14 made of aluminum nitride. The semiconductor chip 12 so mounted, therefore, is airtightly sealed with the sealing member 14 of aluminum nitride. To be specific, the sealing member 14 of aluminum nitride is joined to the substrate in such a manner that the terminal surface of a protuberant external edge part 14a of the U-shaped cross section contacts the surface 11a of the aluminum nitride multilayer substrate 11 supporting the semiconductor chip and a recessed part 14b of the U-shaped cross section receives the semiconductor chip 12. This depressed part 14b fulfills the role of a cavity of the conventional semiconductor package. The junction of the aluminum nitride multilayer substrate 11 and the sealing member 14 of aluminum nitride is formed with a bonding agent 14' formed of such a metal as Pb—Sn solder or Au—Sn solder and excelling in thermal conductivity. Thus, the junction is adapted to avoid interfering with the conduction of heat between the aluminum nitride multilayer substrate 11 and the sealing member 14 of aluminum nitride. When glass or other similar substance possessing poor thermal conductivity is used instead as the bonding agent, the decrease of thermal resistance attained with the metallic layer as mentioned above can be similarly obtained by using the glass bonding agent in the form of a layer of a small thickness not exceeding 100 µm. For this purpose, the thickness of the layer of the glass bonding agent is desired to be not more than 50 µm.

Since the sealing member 14 of aluminum nitride mentioned above is directly joined to the aluminum nitride multilayer substrate 11, the heat generated in consequence of the operation of the semiconductor chip 12 is transmitted through the aluminum nitride multilayer substrate 11 and then released through the sealing member 14 of aluminum nitride and the heat-radiating fins 19 into the ambient air. Thus, the sealing member 14 of aluminum nitride additionally functions as a heat-radiating member. The part of the sealing member 14 of aluminum nitride used for junction (the terminal surface of the protuberant external edge part 14a) directly affects the state of conduction of heat from the aluminum nitride multilayer substrate 11 to the sealing member 14 of aluminum nitride and, therefore, is formed in the largest possible size to be found in due consideration of the accuracy of fabrication of the surface wiring layer 17 and the allowable size of the semiconductor package 10 (inclusive of the space for the formation of the lead pins 13).

The sintered aluminum nitride of which the sealing member 14 is made inherently possesses high thermal conductivity. This thermal conductivity is variable with the quality of raw material for the sintered aluminum nitride and the condition of production thereof, the sintered aluminum nitride to be used for the sealing member 14 is desired to possess the highest possible thermal conductivity. For example, the sealing member 14 is desired to be formed of sintered aluminum nitride the thermal conductivity of which is not less than 170 W/mk. The material of which the aluminum nitride multilayer substrate 11 is made is desired to possess high thermal conductivity. When the multilayer substrate is manufactured by simultaneous firing, slight degradation of thermal conductivity is inevitable.

To the upper side of the sealing member 14 of aluminum nitride mentioned above, the heat-radiating fins 19 in popular use to date are attached. As the material for the heat-radiating fins 19, a metallic material such as aluminum or sintered aluminum nitride equal in quality to the material for the sealing member can be used. When the heat-radiating fins 19 are formed of sintered aluminum nitride, they may be formed integrally with the sealing member 14. Optionally, such heat-radiating fins may be provided on the lower surface 11b side of the aluminum nitride multilayer substrate 11. When the semiconductor package 10 is mounted on a board, these additional heat-radiating fins are intended to effect radiation of heat on the board side.

The semiconductor package 10 of the embodiment described thus far realizes the measure taken to enhance the accuracy of formation of the surface wiring layer 17 and lower the cost of formation thereof in addition to allowing a reduction in the size of package and an increase in the number of pins admitted because the semiconductor chip 12 is mounted directly, namely without using any intervening cavity, on the surface 11a opposite to the surface 11b of the aluminum nitride multilayer substrate 11 for junction with the lead pins 13. Owing to the use of the sealing member 14 of aluminum nitride formed in a U-shaped cross section having a recess for receiving the semiconductor element and the joining material 14' of low thermal resistance, the semiconductor chip 12 directly mounted on the surface 11a of the aluminum nitride multilayer substrate 11 can be infallibly sealed airtightly without obstructing the radiation of heat. The heat emanating from the semiconductor chip 12 can be efficiently radiated through the medium of the aluminum nitride multilayer substrate 11 because the sealing member 14 is formed of sintered aluminum nitride and, at the same time, the sealing member 14 is formed in a U-shaped cross section so as to enlarge the area of junction (area for thermal conduction) with the aluminum nitride multilayer substrate 11 and further because the sealing member 14 is joined to the substrate with a joining material 14' of low thermal resistance. Thus, it is logically concluded that the semiconductor package 10 of the embodiment cited above possesses a satisfactorily high heat-radiating property in addition to realizing the size reduction and the addition to the number of pins to be admitted. Further, since the sealing member 14 of aluminum nitride fulfills the additional function as a heat-radiating member, it allows the heat-radiating fins to be formed in a smaller size and contributes to decreasing the number of component parts of the package. As a result, the cost of production of the semiconductor package can be lowered. The sealing member 14 made of aluminum nitride may be substituted with a metallic sealing member of high thermal conductivity such as, for example, a sealing member made of W-Cu and possessed of a porous texture of tungsten impregnated with copper.

Conceivably, the sealing member 14 of a U-shaped cross section which concurrently serves as a heat-radiating member may be formed of aluminum. In this case, however, the junction of two members having widely different thermal expansion coefficients entails various problems. When a large difference of thermal expansion exists between the two members to be joined, for example, the ceramic member sustains a crack during the process of thermal junction or during the cooling cycle. Even if the impact of this difference in thermal expansion is not so serious as to inflict such a crack on the ceramic member, it imparts appreciable residual stress to the ceramic member. Thus, the difference of thermal expansion heavily degrades the reliability of performance of the product of junction. In the case of this invention, the impact is suspected to inflict a crack on the aluminum nitride multilayer substrate 11. Actually, in this invention, neither the occurrence of a crack nor the degradation of reliability of performance due to such a difference in thermal expansion as described above can be induced particularly when the multilayer substrate 11 and the sealing member 14 are formed of aluminum nitride of equal quality. This fact constitutes itself an important factor in consideration of the use of these components as a semiconductor package.

Now, the second embodiment of this invention will be described below with reference to FIG. 2 and FIG. 3.

Figure 2:
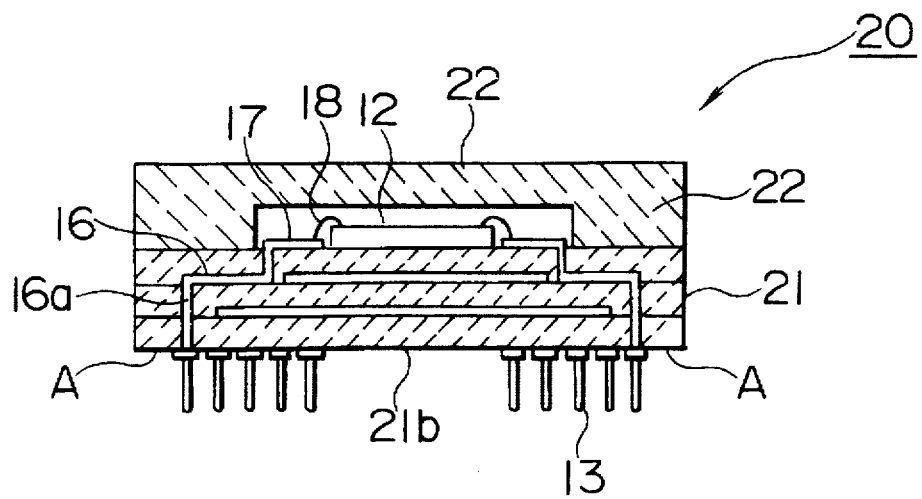
FIG. 2 is a cross section illustrating the construction of a semiconductor package as another embodiment of this invention.
Figure 3:
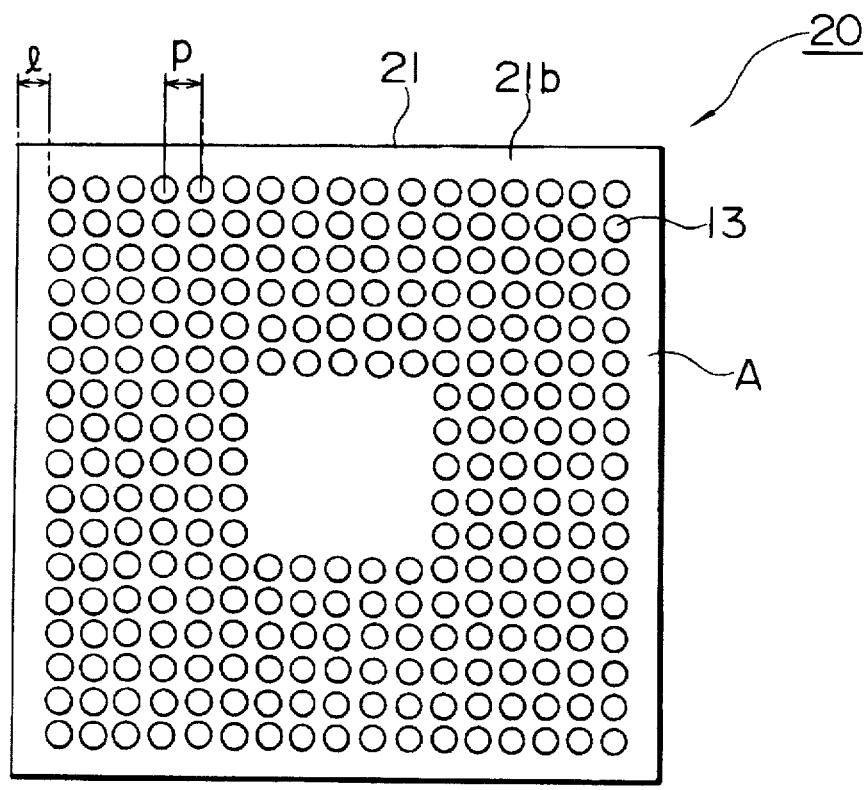
FIG. 3 is a plan view illustrating the lower surface of the semiconductor package shown in FIG. 2.

FIG. 2 is a diagram illustrating the cross-sectional construction of a semiconductor package 20 of this embodiment and FIG. 3 illustrates the lower surface of the semiconductor package, namely the state of junction of junction terminals 13 arrayed after the fashion of a lattice. The semiconductor package 20 illustrated in these diagrams equals the semiconductor package 10 illustrated in FIG. 1 in basic construction, excepting that the junction terminals 13 are so arranged that the distance l from the terminal surface of the external edge of the lower surface 21b of the aluminum nitride multilayer substrate 21 to the junction terminals 13 on the external edge is at least greater than the intercentral distance p between the adjacent junction terminals 13 corresponding to the pitch between the junction terminals. Further, the intercentral distance p between the junction terminals is not more than 1.27 mm.

In other words, the aluminum nitride multilayer substrate 21 is given an area slightly larger than the area to be required as for junction of the junction terminals. This measure is intended to enlarge further the area of junction between the sealing (heat-radiating) member 22 made of aluminum nitride and the aluminum nitride multilayer substrate 21 and, at the same time, decrease the ratio of the length of wirings in the package to the total length of all the wirings. The distance l from the terminal surface of the external edge of the junction terminals 13 is fixed in due consideration of the balance the allowable size of the package and the heat-radiating property desired to be obtained. The junction terminals producing the appearance of a lattice as described above are fastened to the lower surface 21b of the aluminum nitride multilayer substrate 21 as arrayed within an area enclosed with a prescribed area A consisting of four strips of a fixed width bordering on the external periphery of the lower surface 21b. Optionally, positioning pins may be arrayed as joined fast in the strips of the prescribed area A.

The heat-radiating property of the package can be further enhanced by setting apart the particular area A devoid of junction terminals 13 (non-junction area A) as described above and consequently enlarging the area of junction (area of heat conduction) between the sealing (heat-radiating) member 22 made of aluminum nitride and the aluminum nitride multilayer substrate 21. The ratio of the length of wirings in the package to the total length of all the wirings involved can be decreased and, as a result, the package can be adapted to realize the measure taken to enhance the operational speed by forming the non-junction area A in the external edge part of the lower surface 21b of the aluminum nitride multilayer substrate 21 (the area A devoid of junction terminals to be reserved in the external edge part of the lower surface 21b) with due consideration to the convenience of wiring in the multilayer substrate 21 and the pitch separating the junction terminals 13, namely by densely arraying the junction terminals 13 with an intercentral distance of not more than 1.27 mm. Generally, since the wirings on the board side exhibit lower resistance than the internal wirings of the semiconductor package, the phenomena of signal delay and signal attenuation can be repressed by enlarging the ratio of the length of wires on the board side. Although FIG. 2 and FIG. 3 show no use of junction terminals 13 in the central part of the lower surface 21b of the aluminum nitride multilayer substrate 21, the central part may be used for the attachment of such junction terminals.

Figure 4:
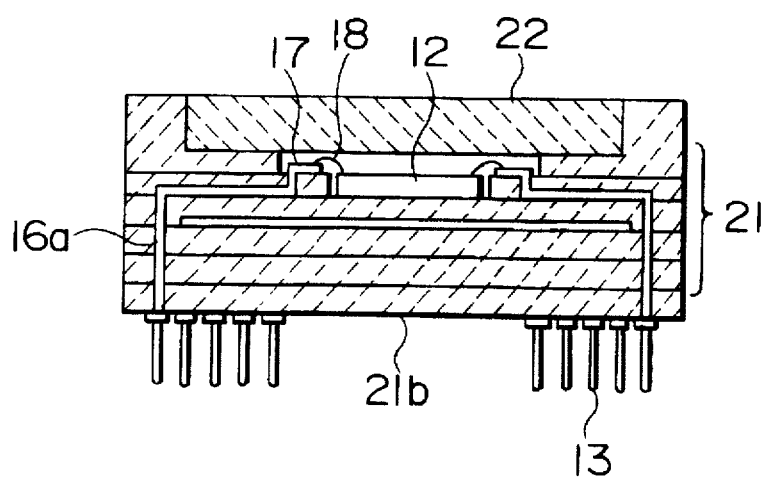
FIG. 4 is a cross section illustrating the construction of a semiconductor package as yet another embodiment of this invention.
Figure 5:
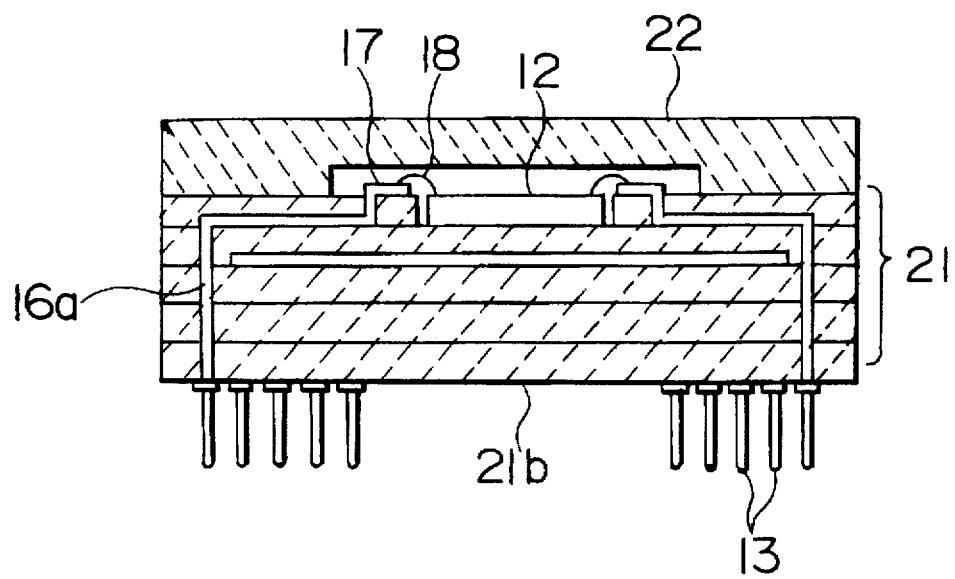
FIG. 5 is a cross section illustrating the construction of a semiconductor package as still another embodiment of this invention.
Figure 6:
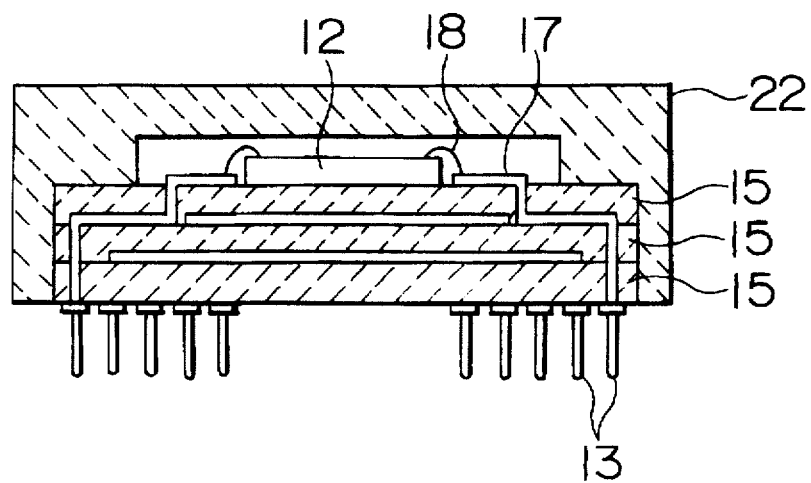
FIG. 6 is a cross section illustrating the construction of a semiconductor package as a further embodiment of this invention.

FIGS. 4 to 6 illustrate examples of the constructions of other semiconductor packages. The semiconductor packages which are illustrated in these diagrams are basically equal in construction to the semiconductor package illustrated in FIG. 1. To be specific, in the semiconductor package of FIG. 4, the aluminum nitride multilayer substrate 21 is formed in the cavity up type and the peripheral part of this substrate 21 is so formed as to function concurrently as a stepped side wall and a sealing (heat-radiating) member 22 made of such a ceramic substance of high thermal conductivity as aluminum nitride is set fast to the peripheral part serving concurrently as a stepped side wall to seal the cavity of the multilayer substrate 21. In the case of this construction, such works as the positioning of the sealing (heat-radiating) member 22 can be performed with appreciable ease. In the semiconductor package of FIG. 5, the aluminum nitride multilayer substrate 21 is formed in the so-called cavity up type and the semiconductor chip 12 mounted thereon is sealed with a sealing (heat-radiating) member 22 made of copper-tungsten and formed in a U-shaped cross section. In the case of this construction, the sealing (heat-radiating) member 22 mentioned above is produced and worked advantageously and, depending on the manner of use of semiconductor modules, is enabled to manifest the function of a magnetic shield.

In the semiconductor package of FIG. 6, the sealing member 22 is formed of such a ceramic substance of high thermal conductivity as aluminum nitride in a U-shaped cross section and the peripheral part thereof is formed as extended so as to serve concurrently as a stepped lateral wall and the terminal surface of the external edge of the aluminum nitride multilayer substrate 21 is set fast in the peripheral part serving concurrently as a stepped lateral wall to seal the cavity of the semiconductor package. Again in the case of this construction, such works as the positioning of the sealing (heat-radiating) member 22 can be carried out with ease. In FIGS. 4 to 6, the same component members as illustrated in FIG. 1 are denoted by the same reference numerals. As the ceramic substance of high thermal conductivity, silicon carbide may be used instead.

Now, concrete examples of the semiconductor packages set forth thus far will be described specifically below. Example 1 and 2 cited below pertains to a concrete example of the semiconductor package illustrated in FIG. 1 and Example 3 to a concrete example of the semiconductor package illustrated in FIG. 2 and FIG. 3.

EXAMPLE 1

First aluminum green sheets conforming to the component ceramic layers 15 were produced, through holes were formed in the green sheets, conductive paste was applied in desired wiring patterns to the green sheets, and the conductive paste was used to fill the through holes. Then, the aluminum nitride green sheets were superposed and subsequently fired (simultaneous firing of aluminum nitride and conductor layers) in a reducing atmosphere to obtain an aluminum nitride multilayer substrate 11 incorporating therein internal wiring layers 16 and measuring 22 mm×22 mm×2.6 mm(t).

Then, a surface wiring layer 17 was superposed by the thin film method on the upper surface 11a of the aluminum nitride multilayer substrate 11 and subsequently lead pins 13 are joined with Ag—Cu solder to the lower surface 11b side of the aluminum nitride multilayer substrate 11 as spaced with a pitch of 1.27 mm. Thereafter, a TEG chip for measurement of thermal resistance was mounted fast as a semiconductor chip 12 on the upper surface 11a of the aluminum nitride multilayer substrate 11 and a bonding wire 18 was provided alongside to complete electrical connection.

Separately, a sealing member 14 (the visible contour; 22 mm×22 mm×3 mm(t), width of terminal surface of the protuberant external edge part 14a; 2.5 mm, and depth of the depressed part; 1 mm) concurrently serving as a heat-radiating member was produced with sintered aluminum nitride of 170 W/mk. This sealing member 14 of aluminum nitride was joined with an Au—Sn solder 14' to the upper surface 11a of the aluminum nitride multilayer substrate 11 having the semiconductor chip 12 mounted thereon and heat-radiating fins 19 were disposed on the sealing member 14 to obtain a complete semiconductor package.

Figure 9:
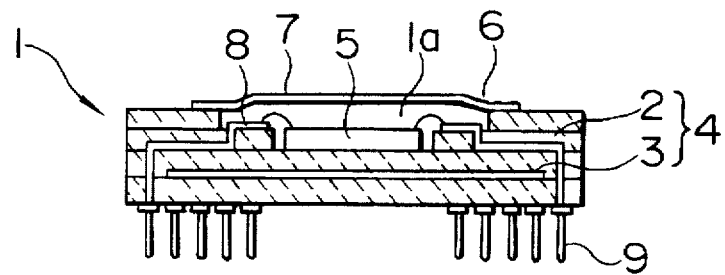
FIG. 9 is a cross section illustrating the construction of a conventional cavity up type semiconductor package.

For comparison with this invention, a conventional cavity up type semiconductor package (equalling the semiconductor package of Example 1 in visible contour) illustrated in FIG. 9 was produced. The cavity 1a of this semiconductor package was sealed airtightly with a cap 6 made of aluminum.

Figure 7:
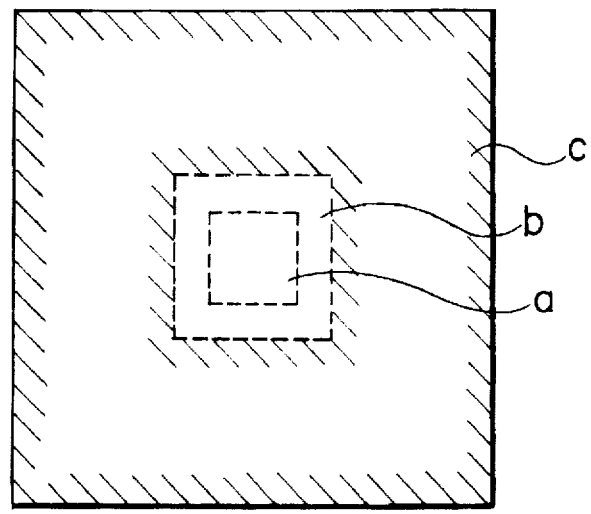
FIG. 7 is a type plan view illustrating an area allowing junction of connecting terminals in the lower surface of a semiconductor package constructed as shown in FIG. 1.
Figure 8:
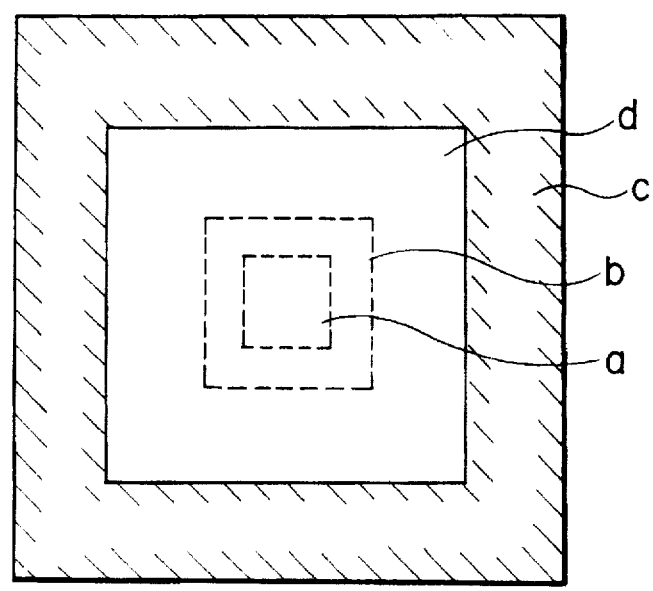
FIG. 8 is a type plan view illustrating an area allowing junction of connecting terminals in the lower surface of a cavity down type semiconductor package.

The semiconductor packages thus obtained in the working example and the comparative experiment were tested for ability to release heat by the $\Delta V_{BE}$ method. It was consequently found that the semiconductor package of the comparative experiment showed thermal resistance of 20° C./W and that of the working example showed thermal resistance of 6° C./W. In the construction of the working example mentioned above, as illustrated in a type diagram of FIG. 7, a relatively wide rear surface area c (hatched area) of the semiconductor package 10 corresponding to the area which excluded the area corresponding to the area of the secondary bonding pad part b inclusive of the area a for mounting thereon the semiconductor chip 12, namely the area a falling outside the secondary bonding pad part b, is utilized as the area for junction of the lead pins, the semiconductor package allows the size reduction and the addition to the number of lead pins for junction. In contrast thereto, the cavity down type semiconductor package in which lead pins were used in the same number and were spaced with the same pitch as in the preceding semiconductor package suffered from an undue increase in size because the area which was utilizable for junction of lead pins was narrow as illustrated in a type diagram of FIG. 8, namely the area was smaller owing to the deduction of the area of the wiring part d adjoining the secondary bonding pad part b. Thus, this semiconductor package allowed the size reduction only with difficulty.

EXAMPLE 2

A semiconductor package was produced by following the procedure of Example 1, excepting a glass bonding agent was used for the union of the sealing member 14 and the aluminum nitride multilayer substrate 11. The layer of the bonding agent had a thickness of 40 μm. In the test for ability to effect heat release performed in the same manner as in Example 1, this semiconductor package exhibited thermal resistance of 6° C./W.

EXAMPLE 3

A semiconductor package 20 was produced by following the procedure of Example 1, excepting the visible contour of the aluminum nitride multilayer substrate was changed to 25 mm×25 mm without any alteration in the shape of the internal wiring layer 16 and the width of the terminal surface of the protuberant external edge part 22a of the sealing member 22 of aluminum nitride changed to 4 mm. In the test for ability to effect heat release performed in the same manner as in Example 1, this semiconductor package exhibited thermal resistance of 3° C./W.

As described above, this invention allows semiconductor packages desired size reduction and, at the same time, ensures provision at low cost of such semiconductor packages that are practically adaptable to the addition of the number of pins and the improvement in the ability to effect heat release which are attendant on further integration of semiconductor elements.

Now, the third semiconductor package of this invention will be described below with reference to the drawings.

Figure 10:
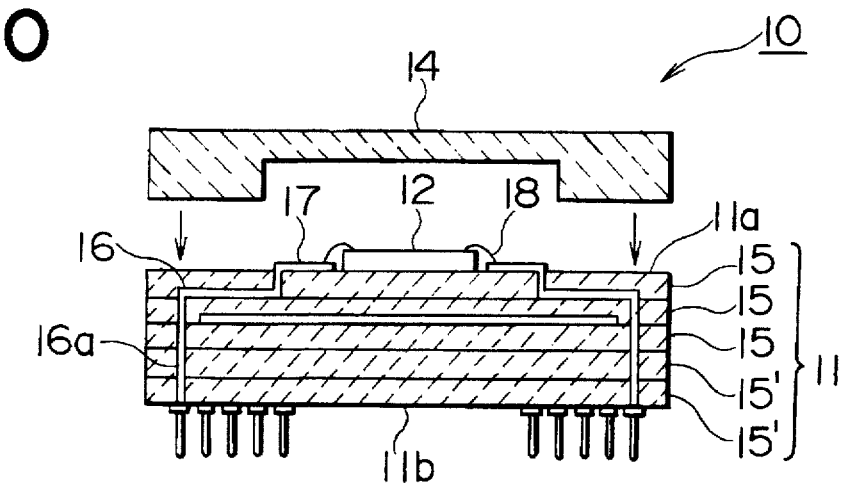
FIG. 10 is a cross section illustrating the construction of a third semiconductor package of this invention.

FIG. 10 is a U-shaped cross section illustrating the construction of one example of the semiconductor package of this invention. In a semiconductor package 10 illustrated in this diagram, a semiconductor chip 12 such as an LSI or a power IC is mounted on an upper surface 11a of an aluminum nitride multilayer substrate 11 and junction terminals 13 are joined to a lower surface 11b of the aluminum nitride multilayer substrate 11. The upper surface 11a of the aluminum nitride multilayer substrate 11 on which the semiconductor chip 12 is mounted is covered with a sealing member 14 of aluminum nitride serving concurrently as a heat-radiating member and formed in a U-shaped cross section.

The aluminum nitride multilayer substrate 11 mentioned above is a multilayer wiring substrate which is formed by integrally superposing a plurality of aluminum nitride layers. The plurality of the layers are divided into two types, i.e. aluminum nitride wiring layers 15 provided with an internal wiring layer 16 having a prescribed wiring pattern and aluminum nitride heat-conducting layers 15' formed solely of an aluminum nitride layer provided with no internal wiring. In other words, the aluminum nitride multilayer substrate 11 is composed of a plurality of aluminum nitride wiring layers 15 provided with an internal wiring layer 16 and a plurality of aluminum nitride heat-conducting layer 15' basically functioning as a path for release of heat. The aluminum nitride wiring layers 15 also function as part of the path for release of heat.

Figure 11:
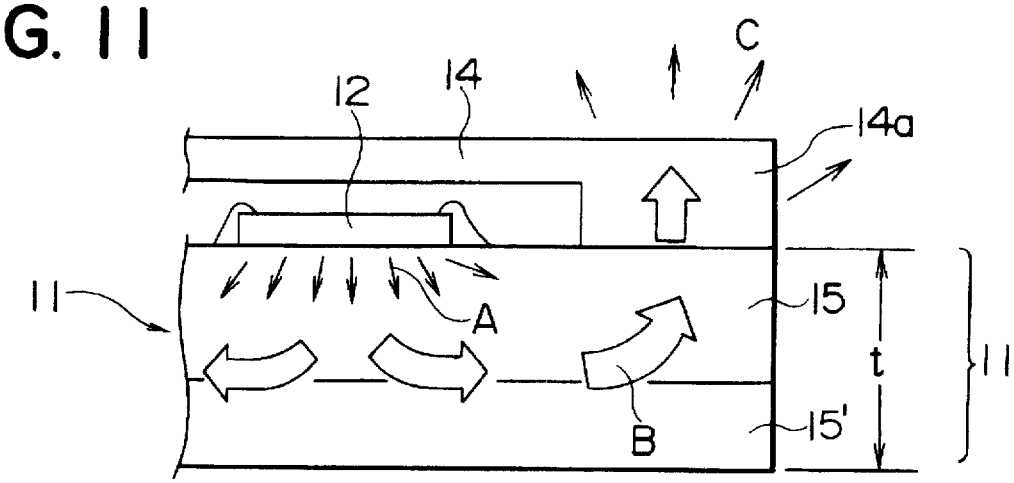
FIG. 11 is a type diagram illustrating the state of transmission of heat in the semiconductor package shown in FIG. 10.

Here, the state of conduction of heat from the semiconductor chip 12 is illustrated by a type diagram of FIG. 11. As shown in FIG. 11, the heat (indicated by an arrow A in the diagram) generated in consequence of the operation of the semiconductor chip 12 is passed at once through the aluminum nitride multilayer substrate 11 (indicated by an arrow B in the diagram), transmitted thence to the sealing member 14 of aluminum nitride serving concurrently as a heat-radiating part, and thereafter dispersed in the ambient air (indicated by an arrow C in the diagram). The thickness t of the aluminum nitride multilayer substrate 11 directly affects the area of the path for release of heat. By increasing the thickness t of the aluminum nitride multilayer substrate 11 with the aluminum nitride heat-conducting layer 15', therefore, the heat-radiating property of the semiconductor package 10 can be improved in a great measure. From the standpoint of internal wiring, since the aluminum nitride multilayer substrate 11 can be formed solely of the aluminum nitride wiring layers 15, the thickness of the aluminum nitride wiring layers can be fixed solely based on electric circuit design. Thus, the conventional electric circuit design can be adopted in its unaltered form and, at the same time, the reduction of the size of visible contour can be realized without being affected by dimensional changes dependent on the improvement in the heat-radiating property, namely by growth in the thickness of the aluminum nitride heat-conducting layers 15'. The aluminum nitride multilayer substrate 11 constructed as described above is produced by simultaneously firing the conductive substances destined to form the aluminum nitride wiring layers 15 and the internal wiring layer 16 in conjunction with the aluminum nitride heat-conducting layers 15'.

The internal wiring layers 16 contain via holes 16a filled with a conductive substance and they are connected electrically to a surface wiring layer 17 formed on the surface 11a of the aluminum nitride multilayer substrate 11 supporting the semiconductor chip through the medium of the via holes 16a. Since the surface wiring layer 17 allows high-density wiring, it is desired to be a thin film wiring obtained by the technology for formation of a thin film such as the spattering method or the vacuum deposition method. The semiconductor chip 12 mounted on the substrate is connected electrically to the surface wiring layer through the medium of a bonding wire 18. The junction terminals 13 are joined to the lower surface 11b of the aluminum nitride multilayer substrate 11 so as to be connected electrically to the internal wiring layer 16.

The surface 11a of the aluminum nitride multilayer substrate 11 on which the semiconductor chip is mounted is covered with the sealing member 14 of aluminum nitride and the semiconductor chip 12 mounted on the surface 11a is sealed airtightly by this sealing member 14 of aluminum nitride. In other words, the sealing member 14 of aluminum nitride is connected to the aluminum nitride multilayer substrate 11 in such a manner that the terminal surface of the protuberant external edge part 14a of a U-shaped cross section is kept in contact with the surface 11a of the aluminum multilayer substrate 11 supporting the semiconductor chip and the recessed part 14b encases the semiconductor chip 12 and this depressed part 14b discharges the part of the cavity of the conventional semiconductor package. The union of the aluminum nitride multilayer substrate 11 with the sealing member 14 of aluminum nitride is effected by the use of a Pb—Sn solder, an Au—Sn solder, or a sealing glass, for example. When such a solder is used for the union, the opposed surfaces to be joined are metallized in advance.

The sealing member 14 of aluminum nitride mentioned above serves concurrently as a heat-radiating member and contributes to the decrease in the number of component parts of the package. Since the area of the part of the sealing member 14 of aluminum nitride used for junction (the area of the terminal surface of the protuberant external edge part 14a) directly affects the state of conduction of heat from the aluminum nitride multilayer substrate 11 to the sealing member 14 of aluminum nitride, it is desired to be increased to the fullest possible extent with due consideration to the precision of formation of the surface wiring layer 17 and the allowable size of the semiconductor package 10 (inclusive of the space used for the formation of junction terminals). The sintered aluminum nitride which constitutes itself the material for the formation of the sealing member 14 inherently possesses high thermal conductivity. Since the thermal conductivity acquired by the sintered aluminum nitride is variable with the quality of the material and the conditions of the production, the sintered aluminum nitride to be used for the sealing member 14 is desired to possess as high thermal conductivity as possible.

To the sealing member 14 of aluminum nitride described above, heat-radiating fins in popular use to date can be attached. As the material of which the heat-radiating fins are made, such a metallic material as aluminum or sintered aluminum nitride equal in quality to the material of the sealing member may be used. When the heat-radiating fins are formed of sintered aluminum nitride, these fins can be integrally formed with the sealing member.

The semiconductor package 10 of the working example cited above basically allows the size reduction of package and the addition to the number of pins because the semiconductor chip 12 can be mounted on as joined fast to the surface 11a which is opposed to the surface 11b of the aluminum nitride multilayer substrate 11 for junction terminals. From the standpoint of electric circuit design, the conventional electric circuit design can be adopted in its unaltered form because it suffices to pay consideration only to the aluminum nitride wiring layer 15. The size reduction of package can be ensured also by heightening wiring density and, on the condition that the size reduction is successfully accomplished, the outstanding heat-radiating property can be acquired because the aluminum nitride heat-conducting layer 15' amply secures a path for release of heat. As respects the heat-radiating property of the semiconductor package 10, the heat from the semiconductor chip 12 can be more efficiently dispersed because the sealing member 14 is formed of sintered aluminum nitride and further because the sealing member 14 is formed in a U-shaped cross section so as to enlarge the area of junction (the area of heat conduction) of the sealing member 14 with the aluminum nitride multilayer substrate 11. Thus, it is logically concluded that the semiconductor package 10 of the working example cited above allows the size reduction and the addition to the number of pins and exhibits a satisfactory heat-radiating property.

Figure 12:
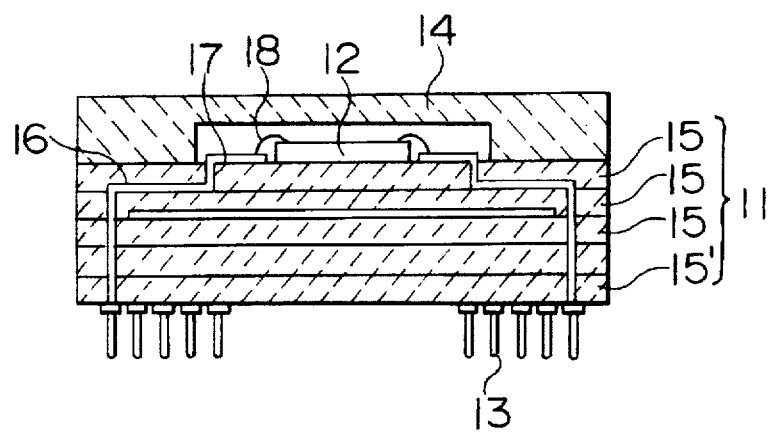
FIG. 12 is a cross section illustrating the construction of a modification of the semiconductor package shown in FIG. 10.
Figure 13:
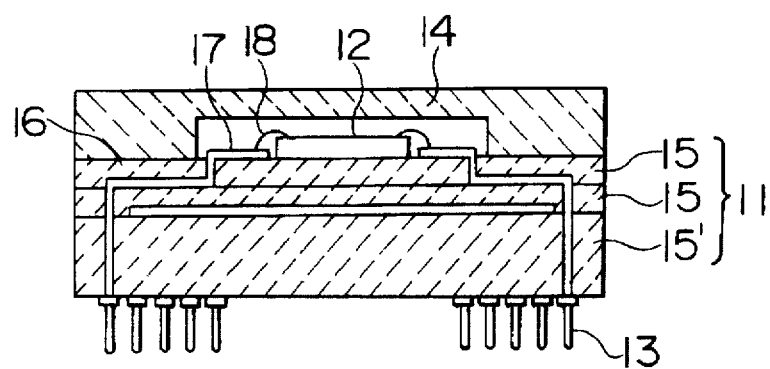
FIG. 13 is a cross section illustrating the construction of another modification of the semiconductor package shown in FIG. 10.

FIG. 12 and FIG. 13 illustrate a modification of the semiconductor package 10 of the working example cited above. The aluminum nitride multilayer substrate 11 may be constructed by superposing a plurality of aluminum nitride heat-conducting layers 15' as illustrated in FIG. 10 so as to secure a required area for the path for release of heat, namely a required thickness t of the multilayer substrate 11. Otherwise, the multilayer substrate 11 having a thickness t necessary for the sake of the heat-radiating property may be produced by using only one aluminum nitride heat-conducting layer 15' as illustrated in FIG. 12. Alternatively, only the lowermost aluminum nitride layer 15 in all the plurality of aluminum nitride wiring layers 15 may be given an increased thickness. In this case, the lowermost layer of aluminum nitride 15 constitutes itself an aluminum nitride heat-conducting layer concurrently serving as a wiring layer.

Now, a working example of the semiconductor package 10 of the embodiment set forth thus far will be cited below.

EXAMPLE 4

First, aluminum nitride green sheets of a thickness of 0.5 mm were produced and through holes were formed in the green sheets in accordance with an electric circuit design. To those of the green sheets which were destined to form aluminum nitride wiring layers 15, conductive paste was applied in a desired wiring pattern and the conductor paste was used to fill the through holes. In the case of those of the green sheets which were destined to form aluminum nitride heat-conducting layers 15', the conductive paste was used only to fill the through holes. Then, these aluminum nitride green sheets were superposed and subsequently fired (simultaneous firing of aluminum nitride in conjunction with conductive layers) in a reducing atmosphere to produce an aluminum nitride multilayer substrate 11 incorporating internal wiring layers 16 and measuring 25 mm×25 mm×2.6 mm(t). Incidentally, in the aluminum nitride multilayer substrate 11, the total thickness of all the aluminum nitride wiring layers 15 was 1.5 mm and the total thickness of all the aluminum nitride heat-conducting layer 15' was 1.1 mm. Then a surface wiring layer 17 wiring layer 17 was formed by the thin film method on the upper surface 11a of the aluminum nitride multilayer substrate 11 and lead pins 13 were joined to the lower surface 11b side of the aluminum nitride multilayer substrate 11 as spaced with a pitch of 1.27 mm by the use of Ag solder. Thereafter, a TEG chip for measurement of thermal resistance was joined to the upper surface 11a of the aluminum nitride multilayer substrate 11 as a semiconductor chip 12 and a bonding wire 18 was additionally disposed thereon to complete electric connection.

Separately, a sealing member 14 [visible contour 25 mm×25 mm×3 mm(6)] concurrently intended as a heat-radiating member was produced with sintered aluminum nitride of 170 W/mk. Then, this aluminum nitride sealing member 14 was joined by the soldering method to the upper surface 11a of the aluminum nitride multilayer substrate 11 having the semiconductor chip 12 mounted thereon, to produce a semiconductor package aimed at.

For the purpose of comparison with this invention, a semiconductor package (thickness of multilayer substrate 1.5 mm) was produced by following the procedure of Example 4, excepting the aluminum nitride multilayer substrate was formed solely of aluminum nitride wiring layers 15 and the use of aluminum nitride heat-conducting layers 15' was omitted.

The semiconductor packages obtained in the working example and the comparative experiment described above, after having been furnished with a semiconductor chip, were tested for ability to effect release of heat by the $\Delta V_{BE}$ method. It was found that the thermal resistance of the semiconductor package of the working example was 0.62 based on that of the semiconductor package of the comparative experiment taken as 1. It is clear from the test results that the semiconductor package of this invention showed an excellent heat-radiating property.

Figure 14:
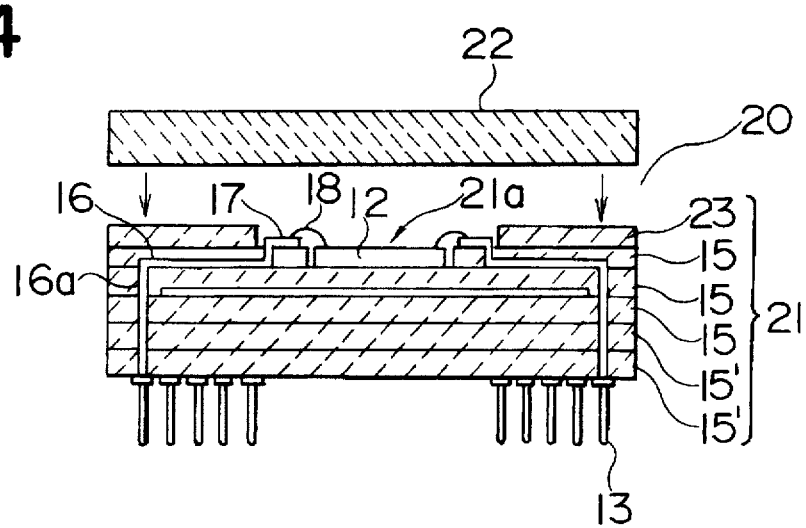
FIG. 14 is a cross section illustration the construction of still another modification of the semiconductor package shown in FIG. 10.

The semiconductor package of this invention is not limited to the type which has the semiconductor chip 12 directly mounted on the upper surface of the aluminum nitride multilayer substrate 11 as illustrated in FIG. 10. This invention is effectively embodied equally in the conventional cavity up type semiconductor package 20 which is constructed as illustrated in FIG. 14. The semiconductor package 20 illustrated in FIG. 14 uses an aluminum nitride multilayer substrate 21 which is provided with a cavity 21a. This cavity 21a encases the semiconductor chip 12. The cavity 21a is airtightly sealed with a platelike sealing member 22 of aluminum nitride which concurrently serves as a heat-radiating member. The aluminum nitride multilayer substrate 21 is composed of a plurality of aluminum nitride wiring layers 15 and a plurality of aluminum nitride heat-conducting layer 15' in addition to a cavity-forming layer 23. This cavity up type semiconductor package 20 produces the same effect as the semiconductor package 10 mentioned above.

The third embodiment of this invention, as described above, realizes the addition to the number of pins and the size reduction of package and allows the provision of a semiconductor package which attains a notable improvement in the ability to effect release of heat without entailing any alteration of electric circuit design. Thus, this invention can provide a semiconductor package practically adaptable to the improvement of semiconductor chips in the degree of integration and the operational speed.

Now, the fourth semiconductor package of this invention will be described below with reference to the accompanying drawings.

Figure 15:
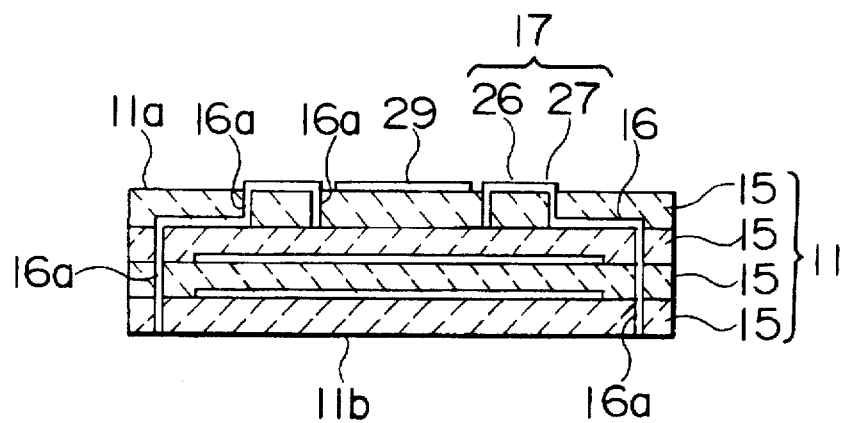
FIG. 15 is a cross section illustrating of the construction of one example of a semiconductor quality ceramic multilayer package to be used in the fourth semiconductor package of this invention.

FIG. 15 is a U-shaped cross section illustrating the construction of a semiconductor quality ceramic multilayer package as one embodiment of this invention. A ceramic multilayer package 30 illustrated in FIG. 15 is basically constructed with an aluminum nitride multilayer substrate 11 having a plurality of aluminum nitride layers 15 integrally superposed. On each aluminum nitride layer 15 of the multilayer substrate 11, an internal signal wiring layer 16 having a prescribed wiring pattern and a ground layer and a power source layer are set in place.

The material of which the aluminum nitride multilayer substrate 11 is made is not particularly restricted. Since the package of this invention is intended to have highly integrated elements and high-speed arithmetic elements as main components thereof, it is desirable to use as the material for the aluminum nitride multilayer substrate 11 aluminum nitride which excels in thermal conductivity. Since the highly integrated elements and high-speed arithmetic elements emit large volumes of heat, the reliability of the multilayer substrate can be enhanced by using such a ceramic material of high thermal conductivity as aluminum nitride.

One main surface 11a of the aluminum nitride multilayer substrate 11 is destined to serve as a surface for mounting a semiconductor chip thereon. On this surface 11a for supporting the semiconductor chip, a surface wiring layer 17 is formed by the technology for the formation of a thin film such as the spattering method or the vacuum deposition method, for example. The thin film surface wiring layer 17 is composed of a connecting pad (MLB pad) 26 destined to form a part for electric connection to the semiconductor chip to be mounted thereon and a thin film surface signal wiring 27. The MLB pad 26 is formed in one terminal part of the thin film surface signal wiring 27. The other terminal part of the thin film signal wiring 27 and the internal signal wiring layer 16 are electrically connected through the medium of via holes 16a. These via holes 16a are arrayed in a plurality of rows. In the diagram, the reference numeral 29 stands for a part for mounting the semiconductor chip thereon. To the other terminal part of the internal signal wiring layer 16 are connected connecting terminal side via holes 16a. By these connecting terminal side via holes 16a', the other terminal part of the internal signal wiring is made to reach the other main surface 11b of the aluminum nitride multilayer substrate 11.

Figure 16:
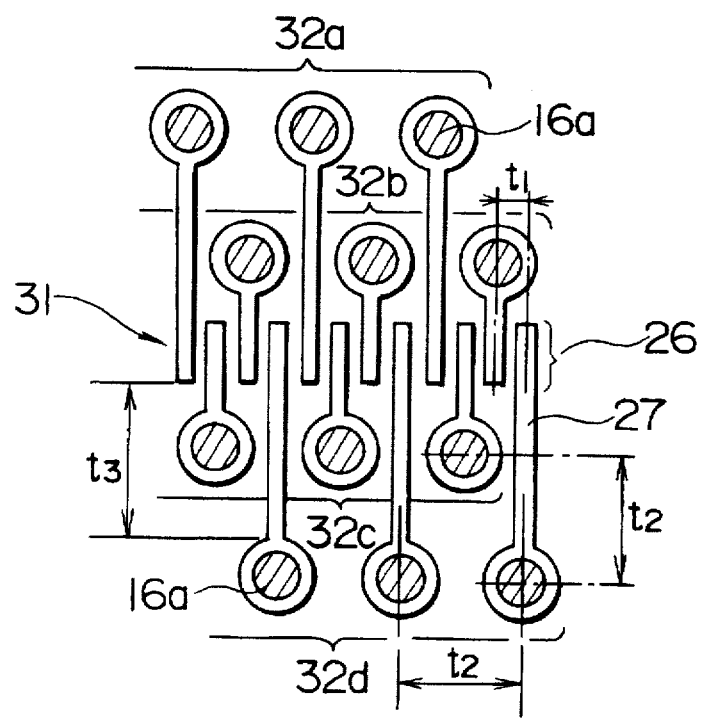
FIG. 16 is a diagram illustrating one example of a thin film surface wiring layer pattern of the ceramic multilayer package shown in FIG. 15.

The MLB pad 26 and the via holes 16a mentioned above are connected with the thin film surface signal wiring 27 having the wiring pattern illustrated in FIG. 16, for example. One example of the connection of the MLB pad 26 and the via holes 16a will be described below with reference to FIG. 16. A row of MLB pads 31 is formed of a thin film wiring with the individual pads spaced with a narrow forming pitch (indicated by $t_1$ in the diagram) of about 100 μm. Rows of via holes 32 are disposed along the opposite sides of the row of MLB pads 31. In the present example, two via hole rows (32a and 32b on one side and 32c and 32d on the other side) are arranged along the opposite sides of the MLB pad row 31. From the via hole rows 32b and 32c which are nearer to the MLB pad row 31, thin film surface signal wirings 27 are extended alternately relative to the MLB pad 26. Then, between these via hole rows, thin film surface signal wirings 27 are extended alternately relative to the MLB pad 26 from the via hole rows 32a and 32d.

Owing to the distribution of the thin film signal wirings 27 in the wiring pattern described above, the thin film surface signal wirings 27 are allowed to have lengths invariably not more than 0.5 mm and specifically the thin film surface signal wirings 27 extended to the MLB pad 26 from the via hole rows 32a, 32d farther from the MLB pad row 31 are allowed to have a very small length of 0.48 mm (indicated by $t_3$ in the diagram) on the condition that the via holes are spaced with a pitch of 400 μm (indicated by $t_2$ in the diagram).

In this embodiment, the length of surface signal wiring is allowed to fall below one quarter of the total length of all the signal wirings because the ceramic multilayer substrate 11 is formed in dimensions of 25 mm×25 mm×2 mm(t) and the total length of all the signal wirings is set at 6 mm. When this ceramic multilayer package golds plated with gold, a perfect package is obtained which shows no discernible sign of short circuit and exhibits wiring resistance of not more than 1 Ω. The object of imparting lowered resistance to the package is attained by fixing the ratio of the length of the surface signal wiring to the total of all the signal wirings below ½, preferably below ¼. Specifically, the length of the surface signal wiring 27 is desired to be not more than 3 mm, preferably not more than 1 mm, and ideally not more than 0.5 mm.

The ceramic multilayer package 30 described above is produced as follows, for example.

EXAMPLE 5

First, aluminum nitride green sheets conforming to the plurality of aluminum nitride layers 15 are produced and through holes are formed in these green sheets. Then, conductive paste containing W and Mo, for example, is applied to the green sheets in desired wiring patterns and, at the same time, the conductive paste is used to fill the through holes. Subsequently, these ceramic green sheets are superposed and the green sheets and the conductive paste are simultaneously fired, to complete a ceramic multilayer substrate 11 which is composed of internal signal wiring layers 16, via holes 16a, 16a, and a ground layer and a power source layer.

On the upper surface 11a of the aluminum nitride multilayer substrate 11, a thin film surface wiring layer 17 of Al and Au (inclusive of a MLB pad 26 and a thin film surface signal wiring 27, for example) is formed in a desired wiring pattern by the spattering method or the vacuum deposition method. Optionally, the thin film surface wiring layer 17 is plated as with Au. In consequence of these steps, the ceramic multilayer package 30 is obtained.

In the ceramic multilayer package 30 of this embodiment, owing to the use of a plurality of via hole rows 32 and the disposition of these via hole rows 32 along the opposite sides of the MLB pad row 31, the thin film surface wiring 27 having higher resistance per unit length than the internal signal wiring layer 16 is allowed to have a decreased length, namely the length of the surface signal wiring is allowed to be not more than ½ of the total length of all the signal wirings. As a result, the package as a whole is allowed to lower resistance and, even when a high-speed operation type semiconductor chip is mounted, is enabled to operate ideally. Further, since the area for the formation of the thin film surface wiring layer 17 can be decreased, the object of reducing the size of the package itself is accomplished, the occurrence of a short circuit during the subsequent step of plating or transportation is curbed, and the yield of production is improved.

In the ceramic multilayer package of this invention, the wiring pattern of the thin film surface wiring layer 17 is not limited to the pattern shown in FIG. 16. A varying wiring pattern can be adopted so long as the length of the surface signal wiring is allowed to be not more than ½ of the total length of all the signal wirings.

Figure 17:
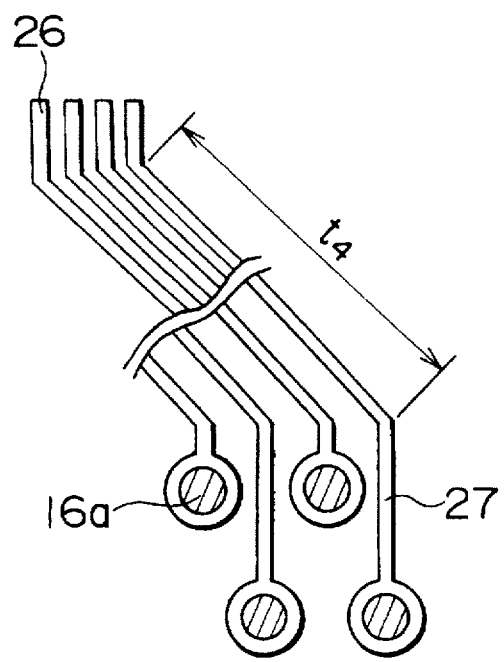
FIG. 17 is a diagram illustrating a pattern cited for the purpose of comparison with the thin film surface wiring layer pattern of the package of this invention shown in FIG. 16.

From the standpoint of ensuring use of a plurality of via hole rows, such a wiring pattern as illustrated in FIG. 17, for example may be adopted for the thin film surface wiring layer 17. In this wiring pattern, however, the length of the surface signal wiring is suffered to increase and, as a result, the length of the surface signal wiring is not allowed to be not more than ½ of the total length of all the signal wirings. This increase in the length of the surface signal wiring compels the package to suffer from unduly high resistance and heavy occurrence of defects. When the wiring is produced in the pattern shown in FIG. 17 in accordance with the same design rule as used in the embodiment cited above, the length of the produced wiring exceeds 5 mm (indicated by $t_4$ in the diagram) and the wiring, when plated with gold, produces short circuits in 10%. The wiring resistance exceeds 1 Ω and is hardly acceptable for the sake of the package.

Figure 18:
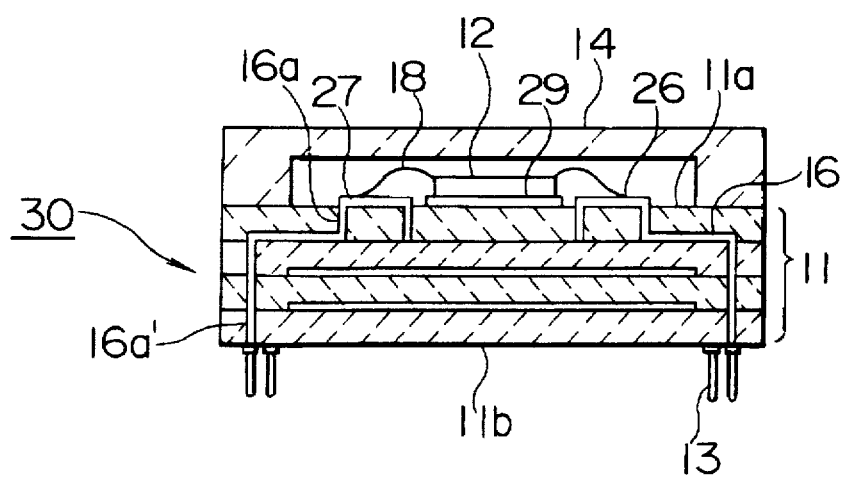
FIG. 18 is a cross section illustrating one example of a semiconductor package completed with the ceramic multilayer package shown in FIG. 15.

The formation of the semiconductor package by the use of the ceramic multilayer package 30 described above is accomplished by forming a part 29 for mounting the semiconductor chip on the upper surface 11a side of the ceramic multilayer substrate 11, joining the semiconductor chip 12 to the semiconductor chip mounting part 29, and electrically connecting this semiconductor chip 12 and the MLB pad 26 through the medium of the bonding wire 18 as illustrated in FIG. 18. This semiconductor chip 12 is airtightly sealed, for example, by joining to the ceramic multilayer substrate 11 the sealing member 14 made of aluminum nitride and formed in a U-shaped cross section. Then, the semiconductor package is completed by joining the connecting terminals to the lower surface 11b side of the ceramic multilayer substrate 11 in such a manner as to be electrically connected to the connecting terminal side via holes 16a'.

The semiconductor package of this invention is not limited to the cavity up type PGA package. This invention can be embodied in various semiconductor packages.

As described above, the fourth semiconductor package of this invention easily accomplishes the object of lowering the resistance of the signal wiring in the package and reducing the size of the package and curbing the occurrence of such defects as short circuits. This invention, therefore, allows stable provision of a ceramic multilayer package which is excellent in reliability and, at the same time, adaptable for high-speed devices.

What is claimed is:

1. A semiconductor package, comprising an aluminum nitride substrate having a semiconductor element mounted on one surface thereof and a wiring pattern electrically connected to said semiconductor element, a multiplicity of connecting terminals electrically connected to said wiring pattern and disposed on the other surface of said aluminum nitride substrate, and a ceramic sealing member joined to said one surface of said aluminum nitride substrate at an area other than a region forming said wiring pattern, through the medium of a junction layer in such a manner as to seal said semiconductor element, said junction layer solely consisting of metal and having no insulating film.

2. A semiconductor package according to claim 1, wherein said metallic layer is an Au—Sn alloy layer.

3. A semiconductor package according to claim 1, wherein said ceramic sealing member has a U-shaped cross section.

4. A semiconductor package according to claim 1, wherein said aluminum nitride substrate having said semiconductor element mounted thereon is a flat-surfaced substrate.

5. A semiconductor package according to claim 1, wherein said ceramic sealing member is formed of aluminum nitride.

6. A semiconductor package, comprising an aluminum nitride substrate having a semiconductor element mounted on one surface thereof and a wiring pattern electrically connected to said semiconductor element, a multiplicity of connecting terminals electrically connected to said wiring pattern and disposed as arranged after the fashion of a lattice on the other surface of said aluminum nitride substrate, the adjacent connecting terminals in said lattice arrangement having an intercentral distance of not more than 1.27 mm (50 mils), and a sealing member joined to said one surface of said aluminum nitride substrate in such a manner as to seal said semiconductor element.

7. A semiconductor package according to claim 6, wherein said sealing member is formed of a ceramic material.

8. A semiconductor package according to claim 7, wherein said sealing member is formed of aluminum nitride.

9. A semiconductor package, comprising an aluminum nitride substrate having a semiconductor element mounted on one surface thereof and a wiring pattern electrically connected to said semiconductor element, a multiplicity of connecting terminals electrically connected to said wiring pattern and disposed as arranged after the fashion of a lattice on the other surface of said aluminum nitride substrate, a distance from an external edge of said aluminum nitride substrate to said connecting terminals being larger than an intercentral distance of the adjacent connecting terminals in said lattice arrangement, and a sealing member joined to said one surface of said aluminum nitride substrate in such a manner as to seal said semiconductor element.

10. A semiconductor package comprising an aluminum nitride multilayer substrate having a semiconductor element mounted on one surface thereof and a wiring pattern electrically connected to said semiconductor element, a sealing member connected to said aluminum nitride multilayer substrate in such a manner as to seal said semiconductor element, and a multiplicity of connecting terminals electrically connected to said wiring pattern and disposed on said one or the other surface of said aluminum nitride multilayer substrate, said aluminum nitride multilayer substrate being formed by having integrally superposed in the direction of thickness aluminum nitride wiring layers provided with an internal wiring and aluminum nitride heat-conducting layers containing no internal wiring layer.

11. A semiconductor package according to claim 10, wherein the thickness of said aluminum nitride heat-conducting layers containing no internal wiring layer is greater than the thickness of said aluminum nitride wiring layer provided with said internal wiring.

12. A semiconductor package comprising an aluminum nitride multilayer substrate having a semiconductor element mounted on one surface thereof and a signal wiring layer electrically connected to said semiconductor element, a multiplicity of connecting terminals electrically connected to said signal wiring layer and disposed as arranged after the fashion of a lattice on the other surface of said aluminum nitride multilayer substrate, said signal wiring layer being connected through via holes, and a surface signal wiring layer set in place on the one surface of said aluminum nitride multilayer substrate and an internal signal wiring layer set in place inside said aluminum nitride multilayer substrate, the length of said surface signal wiring layer being not more than ½ of the length of said signal wiring layer.

13. A semiconductor package according to claim 12, wherein said surface signal wiring layer is provided in one terminal part thereof with a connecting pad and said via holes are disposed along the opposite sides of a row of said connecting pads.

14. A semiconductor package according to claim 12, wherein the length of said surface signal wiring layer is not more than ¼ of the total length of all the signal wiring layers.

* * * * *

UNITED STATES PATENT AND TRADEMARK OFFICE
CERTIFICATE OF CORRECTION

PATENT NO. : 5,703,397
DATED : December 30, 1997
INVENTOR(S) : Mitsuyoshi ENDO et al.

It is certified that error appears in the above-indentified patent and that said Letters Patent is hereby corrected as shown below:

On the Title Page, insert --[73] Assignee: Kabushiki Kaisha Toshiba, Kanagawa-ken, Japan--.

On the Title Page, insert --Attorney, Agent, or Firm —FINNEGAN, HENDERSON, FARABOW, GARRETT AND DUNNER, L.L.P--.

Claim 9, column 20, line 17, "sail" should read --said--.

Claim 13, column 20, line 60, "and-said" should read --and said--.

Signed and Sealed this

Thirtieth Day of June, 1998

Attest:

BRUCE LEHMAN

*Attesting Officer*  *Commissioner of Patents and Trademarks*